(12) United States Patent
Tewari et al.

(10) Patent No.: US 11,055,908 B2
(45) Date of Patent: Jul. 6, 2021

(54) INVERSION OF LARGE, NEARLY-HOMOGENEOUS GEOBODIES VIA ULTRA LOW-DIMENSIONAL SHAPE REPRESENTATION USING ORTHOGONAL BASIS FUNCTIONS

(71) Applicant: ExxonMobil Research and Engineering Company, Annandale, NJ (US)

(72) Inventors: Ashutosh Tewari, Clinton, NJ (US); Dimitar Trenev, Sleepy Hollow, NY (US)

(73) Assignee: ExxonMobil Research and Engineering Company, Annandale, NJ (US)

( * ) Notice: Subject to any disclaimer, the term of this patent is extended or adjusted under 35 U.S.C. 154(b) by 41 days.

(21) Appl. No.: 16/536,569

(22) Filed: Aug. 9, 2019

(65) Prior Publication Data
US 2020/0066035 A1   Feb. 27, 2020

Related U.S. Application Data

(60) Provisional application No. 62/723,191, filed on Aug. 27, 2018.

(51) Int. Cl.
*G06T 17/05*   (2011.01)
*G06T 17/20*   (2006.01)
(Continued)

(52) U.S. Cl.
CPC ............ *G06T 17/05* (2013.01); *G06F 17/16* (2013.01); *G06F 30/23* (2020.01); *G06T 17/20* (2013.01)

(58) Field of Classification Search
CPC . G01V 1/28; G01V 1/282; G01V 1/30; G01V 1/301; G01V 1/302
See application file for complete search history.

(56) References Cited

U.S. PATENT DOCUMENTS 9,121,964 B2   9/2015   Lewis et al.
2011/0131020 A1   6/2011   Meng
(Continued)

FOREIGN PATENT DOCUMENTS

WO   2015118414   8/2015

OTHER PUBLICATIONS

Van Dijk, Nico P., et al. "Level-set methods for structural topology optimization: a review." Structural and Multidisciplinary Optimization 48.3 (2013): 437-472. (Year: 2013).*

(Continued)

*Primary Examiner* — Ryan Mcculley
(74) *Attorney, Agent, or Firm* — Scott F. Yarnell (57) ABSTRACT

A two-stage method for iteratively inverting geophysical data for the purpose of subsurface imaging, including: obtaining at least one geophysical dataset and an initial subsurface model; representing subsurface such that a geometry of a geobody is defined using a set of basis functions, and a number of such basis functions is significantly smaller than the number of cells used in cell-based geobody representations, wherein an order of magnitude reduction is two or more for 2-D domains and 3 or more for 3-D domains; in a first stage, successively updating the initial subsurface model, only for the geobody, by performing iterative low-dimensional geophysical inversion based on minimizing a misfit between simulated geophysical data and the geophysical dataset, wherein the simulated geophysical data is generated from a current subsurface model at each iteration; generating a subsurface image from a final updated subsur- (Continued)

face model obtained via the low-dimensional geophysical inversion, wherein the subsurface image includes an inverted geobody; in a second stage, successively updating the subsurface model with the inverted geobody by performing iterative cell-based geophysical inversion based on minimizing a misfit between simulated geophysical data and the geophysical dataset, wherein the simulated geophysical data is generated from a current subsurface model at each iteration.

12 Claims, 7 Drawing Sheets

(51) Int. Cl.
*G06F 30/23* (2020.01)
*G06F 17/16* (2006.01)

(56) References Cited

U.S. PATENT DOCUMENTS

| 2013/0185040 | A1* | 7/2013 | Starr | G01V 1/28 |
| | | | | 703/6 |
| 2014/0350897 | A1* | 11/2014 | Hobro | G06T 17/00 |
| | | | | 703/1 |
| 2019/0302293 | A1* | 10/2019 | Zhang | G01V 1/303 |
| 2019/0331812 | A1* | 10/2019 | Liu | G06T 17/05 |
| 2019/0369278 | A1* | 12/2019 | Zhang | G06F 30/00 |

OTHER PUBLICATIONS

Zhaohui Guo et al., "Shape optimization and level set method in full waveform inversion with 3D body reconstruction," SEG Technical Program Expanded Abstracts, 2013, pp. 1079-1083.

Winston Lewis et al., "A level set approach to salt geometry inversion in full-waveform inversion," SEG Technical Program Expanded Abstracts, 2012, pp. 1-5.

Denes Vigh et al, "Breakthrough acquisition and technologies for subsalt imaging," Geophysics, Society of Exploration Geophysicists, 2011, vol. 76, No. 5, pp. WB41-WB51.

Aghasi, et al., Parametric Level Set Methods for Inverse Problems, Siam Journal of Imaging Sciences, vol. 4, No. 2, pp. 618-650, 2011.

Kadu, et al., Salt Reconstruction in Full Waveform Inversion with a parametric Level-Set Method, IEEE Transactions on Computational Imaging, vol. 3, No. 2, pp. 305-315, 2017.

Kadu, et al., Parametric Level-Set Full-Waveform Inversion in the Presence of Salt Bodies, SEG Technical Program Expanded Abstracts, pp. 1518-1522, 2017.

Rasmussen, et al., Gaussian Processes in Machine Learning, Advanced Lectures on Machine Learning, Chapter 4: Covariance Functions, ML Summer Schools, pp. 63-71, 2003.

Vanmarcke, Random Fields: Analysis and Synthesis, Chapter 2: Fundamentals of Analysis of Random Fields, World Scientific Publishing Company, pp. 13-74, 2010.

Lewis, et al., A Level Set Approach to Salt Geometry Inversion in Full-Waveform Inversion, SEG Technical Program Expanded Abstracts, pp. 1-5, 2012.

Vigh, et al., 3D Full Waveform Inversion on a Gulf of Mexico WAZ Data Set, SEG Technical Program Expanded Abstracts, pp. 957-961, 2010.

Fasshauer, et al., Kernel-Based Approximation Methods Using MATLAB, Interdisciplinary Mathematical Sciences: vol. 19, Chapter 5: Connection to Kriging, pp. 89-107, 2015.

Tarantola, A., Inversion of Seismic Reflection Data in the acoustic Approximation: Geophysics, 49, pp. 1259-1266, 1984.

Halko, et al., Finding Structure with Randomness: Probabilistic Algorithms for Constructing Approximate Matrix Decompositions: SIAM Review, vol. 53, No. 2, pp. 217-288, 2011.

Drineas, et al., Fast Monte Carlo Algorithms for Matrices II: Approximating Matrix Multiplication, SIAM Journal on Computing, vol. 36, No. 1, pp. 132-157, 2006.

* cited by examiner

INVERSION OF LARGE, NEARLY-HOMOGENEOUS GEOBODIES VIA ULTRA LOW-DIMENSIONAL SHAPE REPRESENTATION USING ORTHOGONAL BASIS FUNCTIONS

CROSS-REFERENCE TO RELATED APPLICATIONS

This application claims the benefit of U.S. Provisional Application No. 62/723,191 filed Aug. 27, 2018, which is herein incorporated by reference in its entirety. The present application is related to U.S. patent application Ser. No. 15/492,316.

FIELD OF THE INVENTION

This disclosure relates generally to the field of geophysical prospecting and, more particularly, to seismic data processing. Specifically the disclosure relates to a method for performing full wavefield inversion ("FWI") of geophysical data of subsurface regions with salt bodies.

BACKGROUND OF THE INVENTION

This section is intended to introduce various aspects of the art, which may be associated with exemplary embodiments of the present technological advantage. This discussion is believed to assist in providing a framework to facilitate a better understanding of particular aspects of the present technological advancement. Accordingly, it should be understood that this section should be read in this light, and not necessarily as admissions of prior art.

An important goal of seismic prospecting is to accurately image subsurface structures commonly referred to as reflectors. Seismic prospecting is facilitated by obtaining raw seismic data during performance of a seismic survey. During a seismic survey, seismic energy can be generated at ground or sea level by, for example, a controlled explosion (or other form of source, such as vibrators), and delivered to the earth. Seismic waves are reflected from underground structures and are received by a number of sensors/receivers, such as geophones. The seismic data received by the geophones is processed in an effort to create an accurate mapping of the underground environment. The processed data is then examined with a goal of identifying geological formations that may contain hydrocarbons (e.g., oil and/or natural gas).

FWI is a computer-implemented geophysical method that is used to invert for subsurface properties such as velocity or acoustic impedance. The crux of any FWI algorithm can be described as follows: using a starting subsurface physical property model, synthetic seismic data are generated, i.e. modeled or simulated, by solving the wave equation using a numerical scheme (e.g., finite-difference, finite-element etc.). The term velocity model or physical property model as used herein refers to an array of numbers, typically a 3-D array, where each number, which may be called a model parameter, is a value of velocity or another physical property in a cell, where a subsurface region has been conceptually divided into discrete cells for computational purposes. The synthetic seismic data are compared with the field seismic data and using the difference between the two, an error or objective function is calculated. Using the objective function, a modified subsurface model is generated which is used to simulate a new set of synthetic seismic data. This new set of synthetic seismic data is compared with the field data to generate a new objective function. This process is repeated until the objective function is satisfactorily minimized and the final subsurface model is generated. A global or local optimization method is used to minimize the objective function and to update the subsurface model.

Geophysical inversion is often carried out through the minimization of a cost function which includes a least-squares data misfit and a regularization term (Parker, 1994). Such a cost function typically takes the form $$c(\kappa) = \sum_{x_r \in M} \left\| u(\kappa)|_{x_r} - \bar{u}|_{x_r} \right\|^2 + R(\kappa), \tag{1}$$

where $\kappa$ denotes spatially varying model parameter(s) to be determined through optimization, $u(\bullet)$ is the forward modeling operator that maps the model parameters to the measured geophysical data $\bar{u}|_{x_r}$, $x_r \in M$ denotes the locations at which the data is measured and is the norm used to quantify the misfit between the computed and the measured data. The term $R(\kappa)$ is a regularization term (e.g. Tikhonov regularization) needed to stabilize the inversion owing to the severe ill-posedness intrinsic to these problems.

Although the true physical parameter $\kappa$ is defined at every point of a subsurface domain $\Omega$, it is typically discretized, for computational purposes, when optimizing the cost function $c(\kappa)$. Such a discretization amounts to first partitioning the subsurface domain $\Omega$ into disjoint cells $\Omega_i$ (with centroid $\overline{\Omega}_i$), such that $\Omega = \cup \Omega_i$, and then setting $\kappa(x) = \kappa_i$ for $x \in \Omega_i$. One such partitioning is a regular Cartesian grid. The parameter values $\{\kappa_i\}$ are determined by optimizing equation (1) using a gradient-based optimization technique such as Gauss-Newton, quasi-Newton, or steepest descent.

For certain problems, involving large homogeneous geobodies such as salt, the ill-posedness of the optimization problem in equation (1) can be alleviated, to some extent, by leveraging the structure imposed by such geobodies. For instance, one such approach involves the use of level-set functions to represent salt bodies [6]. It has been shown that having the knowledge of salt geometry can greatly enhance the performance of the cell-based FWI as a subsurface imaging technique [7]. In the absence of the knowledge of salt geometry, the cell-based FWI does not honor, lest exploit, the structure induced by the salt bodies. This is because pure cell-based FWI, by definition, does not determine sharp boundaries associated with geobodies, but rather determines parameter values in individual cells. As a result, the inversion produces blurred images of geologic structures which, otherwise are sharp. On the other hand, in the level-set approach, the subsurface domain ($\Omega$) is represented by partitioning it into an anomalous region (S) and the background ($\Omega \backslash S$), thereby allowing for sharp boundaries between salt and the sediments by definition. With this representation any spatial property of interest (the unknown model parameters) can be represented as:

$$\kappa_i = \begin{cases} \kappa_{sa} & \text{if } \Omega_i \in S \\ \kappa_{bg}(\Omega_i) & \text{if } \Omega_i \in \Omega \backslash S \end{cases}, \tag{2}$$

where, $\kappa_{sa}$ is a scalar property which is invariant within the salt and is assumed given, $\kappa_{bg}(\Omega_i)$ is the unknown sediment property at the cell $\Omega_i$. Here the subscript bg means background and refers to the sediments surrounding the salt body.

The basic idea of the level-set method is to define the boundary between $\Omega$ and S as the zero contour of a level-set function $\phi(x)$. Let the salt body be defined as $S=\{x|\phi(x)\geq 0\}$, the model parameters can then be expressed as $$\kappa_i=[1-h(\phi_i)]\kappa_{bg}(\Omega_i)+h(\phi_i)\kappa_{sa}, \quad (3)$$

where, $\phi_i$ denotes the level set function evaluated at the centroid of the $i^{th}$ cell i.e. $\phi_i=\phi(\Omega_i)$ and h(•) is a smooth approximation of the Heaviside function.

The minimization problem in equation (1) then amounts to iteratively inverting for the level-set function values $\{\phi_i\}_{i=1}^n$ and the sediment properties $\{\kappa_{bg}(\Omega_i)\}_{i=1}^n$ corresponding to the n cells. Aghasi et al. [1] proposed an extension called parametric level-set approach, for general inverse problems, which defines the level-set function as a linear combination of p radial basis functions $\Psi: \mathbb{R} \to \mathbb{R}$ having a special form i.e. $\Psi(r)=\exp(-r^2)$. The $j^{th}$ basis function is parameterized by $\alpha_j$, $\beta_j$ and $\chi_j$, denoting its relative contribution, scale and the location (center), respectively.

$$\phi_i=\Sigma_{j=1}^P\alpha_j\Psi(\|\beta_j(\overline{\Omega}_i-\chi_j)\|) \quad (4)$$

The main intent of the parametric level-set method is to reduce the dimensionality of the inversion space. Aghasi et al. [1] show that the resulting low-dimensional representation bypasses many difficulties with traditional cell-based representation and makes the resulting nonlinear optimization more amenable to quasi-Newton methods. Recently, Kadu et al. [2-3] show that a variety of salt geometries can be represented, if the centers $\chi_j$ of the basis functions are affixed at the grid points of a coarser mesh with p (p<n) cells, and if the scale parameter $\beta_j$ is held constant and shared by all the basis functions. In this setting, the inversion amounts to optimizing over p unknown parameters, $\{\alpha_j\}_{j=1}^P$. Another formulation involves optimizing over the centers and the scale parameters, as well, leading to (d+2)×p unknowns corresponding to $\{\alpha_j, \beta_j,\chi_j\}_{i=1}^P$ where d is the dimensionality of the domain. Although parametric level-set methods can achieve a significant reduction in the dimensionality of the inversion space, it may not be enough for large 2D and, even more so, for 3D domains. Moreover, the coarser mesh on which the radial basis functions are centered, needs to have certain degree of fineness to be able to represent salt bodies of varying geometries.

SUMMARY OF THE INVENTION

A two-stage method for iteratively inverting geophysical data for the purpose of subsurface imaging, including: obtaining at least one geophysical dataset and an initial subsurface model; representing subsurface such that a geometry of a geobody is defined using a set of basis functions, and a number of such basis functions is significantly smaller than the number of cells used in cell-based geobody representations, wherein an order of magnitude reduction is two or more for 2-D domains and 3 or more for 3-D domains; in a first stage, successively updating the initial subsurface model, only for the geobody, by performing iterative low-dimensional geophysical inversion based on minimizing a misfit between simulated geophysical data and the geophysical dataset, wherein the simulated geophysical data is generated from a current subsurface model at each iteration; generating a subsurface image from a final updated subsurface model obtained via the low-dimensional geophysical inversion, wherein the subsurface image includes an inverted geobody; in a second stage, successively updating the subsurface model with the inverted geobody by performing iterative cell-based geophysical inversion based on minimizing a misfit between simulated geophysical data and the geophysical dataset, wherein the simulated geophysical data is generated from a current subsurface model at each iteration.

In the method, the examples of geophysical inversion can include full wavefield inversion, travel-time tomography, gravity inversion and magnetic inversion, among others.

In the method, the set of basis functions can be orthogonal.

In the method, the set of orthogonal basis functions can approximate a random field endowed with a positive definite kernel function, and wherein a positive definite kernel function characterizes the geometry of a geobody.

In the method, the set of ordered orthogonal basis functions can be obtained by an eigen-decomposition a n×n kernel matrix (n=number of cells) to yield eigenvectors and eigenvalues, and the method includes truncating the number of the eigenvectors to keep for geobody representation.

In the method, the eigen-decomposition of a kernel matrix can be performed using a matrix-free, randomized algorithm for matrix factorization.

In the method, the linear combination of the truncated set of ordered eigenvectors can undergo a transformation using a twice-differentiable approximate Heaviside function to yield shapes with boundaries whose sharpness is controlled by the Heaviside function's parameter.

In the method, coefficients of the truncated set of ordered eigenvectors along with parameters of the Heaviside function form unknowns that are updated iteratively by the low-dimensional geophysical inversion.

The method can further include obtaining a gradient and a Jacobian of a function describing the misfit with respect to a low-dimensional parameter space in the first stage, from a gradient and a Jacobian of a function describing the misfit with respect to cell-space via application of chain rule.

The method can further include approximating a Gauss-Newton Hessian of a function describing the misfit with respect to a low-dimensional parameter space by sub-sampling a Jacobian in the first stage.

The method can further include causing a well to be drilled at a location derived from the subsurface image.

In the method, the geobody is a salt body.

BRIEF DESCRIPTION OF THE DRAWINGS

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims. It should also be understood that the drawings are not necessarily to scale, emphasis instead being placed upon clearly illustrating principles of exemplary embodiments of the present invention. Moreover, certain dimensions may be exaggerated to help visually convey such principles.

DETAILED DESCRIPTION OF THE INVENTION

Exemplary embodiments are described herein. However, to the extent that the following description is specific to a particular embodiment, this is intended to be for exemplary purposes only and simply provides a description of the exemplary embodiments. Accordingly, the invention is not limited to the specific embodiments described below, but rather, it includes all alternatives, modifications, and equivalents falling within the true spirit and scope of the appended claims.

The present technological advancement addresses the problem of geophysical inversion of large, nearly-homogeneous geobodies in a Full Waveform Inversion (FWI) framework. Of particular interest are subsurface salt bodies, as they serve as excellent seals for hydrocarbon reservoirs. For instance, there are many examples in the Gulf of Mexico and more recently offshore Brazil, where oil-bearing carbonate rocks are buried under thick complex layers of salt. Salt bodies offer a sharp contrast (with respect to their surrounding) to the incident seismic waves, which causes significant signal attenuation underneath them, thereby limiting the performance of FWI as a subsurface imaging technique. Making use of the weak seismic signals reflected by the regions below salt is quite difficult in the traditional cell-based representation of the subsurface, mainly due to the sheer number of (uncorrelated) degrees-of-freedom offered to explain the signals. The large number of unknowns in cell-based FWI renders the objective function in (1) ill-posed, in which case there may not be a unique solution or the solution is very sensitive to the noise in the geophysical data.

The present technological advancement proposes an ultra low-dimensional representation of salt bodies that alleviates the aforementioned challenge with the cell-based FWI by implicitly constraining the objective function. The present technological advancement is grounded on a stochastic view of the subsurface that treats the presence of salt bodies as a spatial random process. In this setting, a salt body can be represented as a linear combination of a set of ordered, orthogonal basis functions with increasingly small contribution in the representation of a salt body. Low-dimensionality is then achieved by truncating the number of basis functions to be included in the representation of the salt body. This truncation drastically reduces the dimension of the inversion space. The number of such basis functions is significantly smaller than the number of cells typically used in cell-based geobody representations; wherein the order of magnitude is 2 or more for 2-D domains, 3 or more for 3-D domains, or 2-4 for 2-D domains and 3-4 for 3-D domains. When coupled with state-of-the-art optimization algorithms to minimize the quadratic loss function of FWI, the proposed representation is shown to reconstruct the complete geometry of salt bodies, where cell-based representation could only recover the top of the salt. It should be noted that, even though the examples discussed herein pertain to inversion of the salt bodies, the present technological advancement applies to any other nearly homogeneous geobody of interest. Also, even though the examples discussed herein pertain to FWI and seismic data, the present technological advancement can apply to other inversion techniques and that use other types of geophysical data (e.g., travel-time tomography, magnetic, electromagnetic or gravity data).

The present technological advancement can follow the same subsurface parameterization scheme as the one defined by the level set-method (equation 3). A key difference, however, exists in the way the present technological advancement can parameterize the level-set function. Instead of specifying a parametric form as shown in equation 4, the present technological advancement takes a stochastic viewpoint and treats the level-set function as a random field (RF). Random fields (or stochastic spatial processes) have been used in statistics and machine learning to model spatial datasets that include images, seismic data, geostatistical and geopolitical data among others [5, 8]. The main benefit of using RFs to represent a shape, compared to parametric level-sets, is that it can lead to an ultra low dimensional shape representation, while retaining the ability to represent myriad of salt geometries. Such low dimensionality not only improves the ability to invert for salt in a deterministic setting, but also opens up venues to perform inversion in a Bayesian setting, which is a much harder proposition in cell-based representations. The primary objective in the latter is to quantify uncertainty in the geometry of a salt body and provide a seismic interpreter with a set of plausible scenarios as opposed to just one.

In the present technological advancement, the level set function is represented as a random field in the sense that the value of the level set function $\phi_i$ at location $\overline{\Omega}_i$ is a random variable that can determine (after appropriate transformation) a location of salt bodies in the domain). Consequently, the finite set $\{\phi_i\}_{i=1}^n$ comprising of level-set function values at the n grid points, is a collection of random variables. Additionally, the random field is called a Gaussian random field (GRF) if the finite set $\{\phi_i\}_{i=1}^n$ has a multivariate normal distribution with mean $\mu$ and covariance matrix $K \in \mathbb{R}^{n \times n}$. The $(i,j)^{th}$ element of the covariance matrix $K_{ij} = k(\overline{\Omega}_i, \overline{\Omega}_j)$, is defined using a bivariate kernel function k: $\mathbb{R}^2 \times \mathbb{R}^2 \to \mathbb{R}$ that defines a measure of similarity between two points. For the definition of positive definite kernel function, see section 4.1 by Rasmussen et al (2006) [4]. There is a large selection of kernel functions to choose from [4]; most popular being the radial kernels $k(\overline{\Omega}_i, \overline{\Omega}_j) = k(\|\overline{\Omega}_i - \overline{\Omega}_j\|)$, which define similarity between two points as a function of Euclidean distance between them. The resulting covariance matrix is such that spatially closer cells have a higher covariance than the cells located away from each other. As a result, the RF tend to assume similar values at spatially nearby cells.

This behavior of RFs is consistent with the geology of salt formations, where spatially closer regions are more likely to be in a salt body than the regions far away from each other. This is a very concise definition of RFs. Detailed treatment on this subject can be found in [5, 8].

Figure 1A:
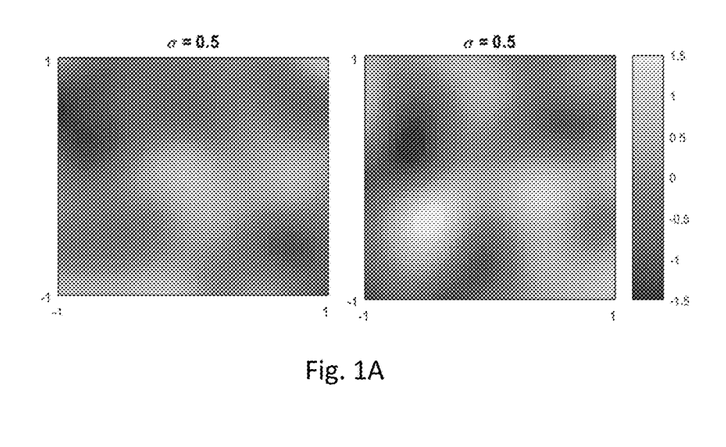
FIG. 1A illustrates two exemplary realizations of a zero mean Gaussian random field (GRF) on a square domain.
Figure 1B:
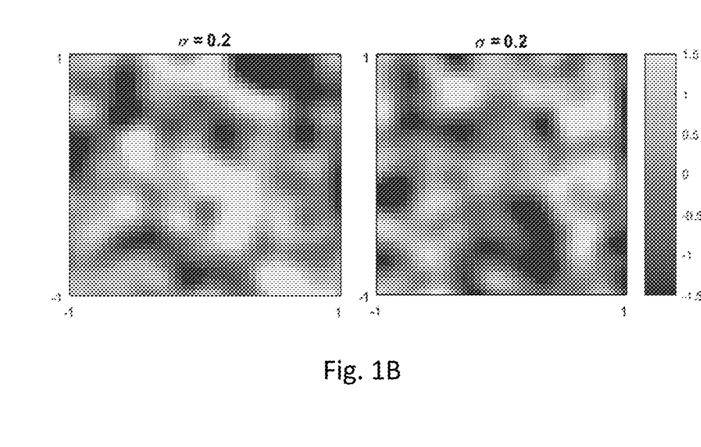
FIG. 1B illustrates another two exemplary realizations of a zero mean Gaussian random field (GRF) on a square domain, but with a different smoothness relative to FIG. 1A.

FIGS. 1A, 1B, 2A, and 2B illustrate the idea of representing salt bodies using RFs. FIGS. 1A and 1B show two realizations of a zero mean GRFs on a square domain $[-1, 1]^2$ that is uniformaly gridded into 41×41 cells. A zero-mean GRF is defined with a covariance matrix obtained using a squared exponential kernel of the form $k(\overline{\Omega}_i, \overline{\Omega}_j) = e^{-\|\overline{\Omega}_i - \overline{\Omega}_j\|/\sigma^2}$. Each realization obtained from a GRF amounts to sampling from a multivariate Gaussian with a known mean vector (0 in this case) and the covariance matrix obtained by applying the aforementioned kernel function to every pair of grid cells. The parameter σ controls the smoothness of the RF. FIG. 1A shows two realizations of a spatially smoother RF with σ=0.5. FIG. 1B shows the same but with σ=0.2, which reduces the smoothness of the RF. The level of smoothness governs how scattered the salt body is in the domain. A smoother RF will result in large contiguous salt bodies and vice-versa. This parameter can be set based on an expectation from the geological understanding of the subsurface. Another option is to have a suite of models of varying smoothness and use all of them independently for inversion. Finally, one could choose the model which gave the best result based on some metric (such as misfit on out-of-sample data). The present examples just used a single value of smoothness that worked well for the synthetic examples.

To define a shape, with sharp boundaries, from a RF another transformation can be used, for example, $h: \mathbb{R} \to [0, 1]$ that maps the RF from a real space to an interval between 0 and 1. A typical choice is to use a sigmoid transformation of the form shown in equation 5. Other sigmoid functions are equally valid (tanh, arctan, error-function etc.) as long as they are twice differentiable.

$$h(\phi_i) = \frac{1}{1 + e^{-\xi(\phi_i - x_0)}} \tag{5}$$

After the sigmoid transformation, the cells with values closer to 1 constitute the shape of the geobody and the ones closer to 0 form the background. Closeness may be in terms of Euclidean distance; but other distance methods could be used. The parameters $x_0$ and $\xi$ govern the characteristics of the boundary and the shape of salt bodies (below, these parameters can be absorbed into Θ).

Figure 2A:
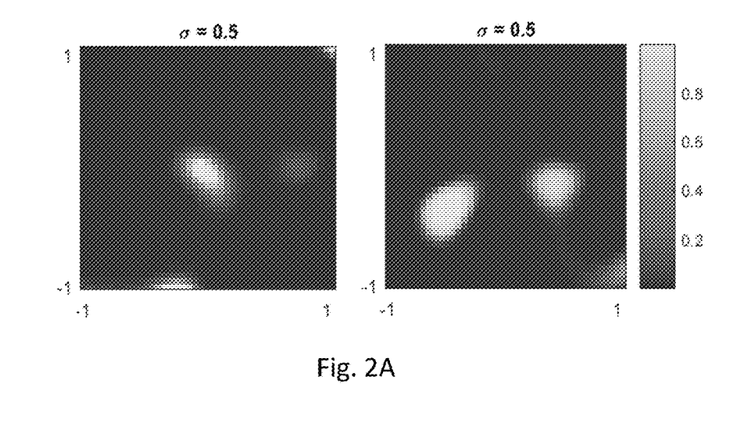
FIG. 2A illustrates an exemplary sigmoid transformation of the random field shown in FIG. 1A, resulting in shapes with sharp boundaries.
Figure 2B:
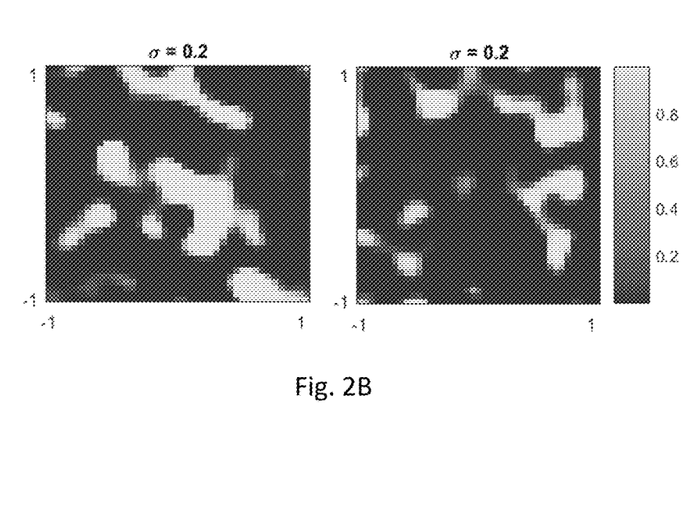
FIG. 2B illustrates an exemplary sigmoid transformation of the random field shown in FIG. 1B, resulting in shapes with sharp boundaries.

FIGS. 2A and 2B show the results of this transformation on the realizations of the RFs shown in FIGS. 1A and 1B. For this example, the parameters $x_0$ and $\xi$ were fixed at 5 and 1 respectively. Thus, the present technological advancement provides a mechanism to generate arbitrary shapes by specifying a stochastic model whose parameterization controls the characteristics of the shapes. Note that the extension to 3D domain is straight forward, except that the resulting covariance matrices are very large due to the gridding of a 3D domain.

As established by the above, a stochastic viewpoint can be used to instantiate random realization of shapes in the subsurface. This representation can be used in an FWI framework because of an ability to represent a RF using a set of orthogonal basis functions. The Karhunen-Loeve transform [8] states that a continuous RF φ with mean μ covariance kernel $k: \Omega \times \Omega \to \mathbb{R}$ admits an orthogonal expansion of the form, $$\phi_x = \mu + \Sigma_{j=1}^{\infty} a^j \sqrt{\lambda^j} \varphi_x^j, \tag{6}$$

where, $\lambda^j$ and $a^j$ are the positive eigenvalue and the unknown coefficient associated with the $j^{th}$ eigenfunction, $\varphi^j$, defined with respect to the kernel function $k(\bullet, \bullet)$. The symbol $\varphi_x^j$ denotes the value of the $j^{th}$ eigenfunction evaluated at spatial location x i.e. $\varphi_x^j = \varphi^j(x)$. Note that, in practice, the infinite sum above can be truncated (as the eigenvalues can be ordered to make the discarded "tail" arbitrarily small), thus, one can use a finite set of eigenfunctions to approximate the random field. This feature can be exploited in representing the salt-bodies using only a small set of eigenfunction-eigenvalue pairs. In a discrete setting, the eigenfunctions (or eigenvectors since discretized) are obtained by performing the Singular Value Decomposition (SVD) of the covariance matrix $K \in \mathbb{R}^{n \times n}$. In this setting, the infinite sum in equation (6) is replaced by summation up to n (number of cells) terms. The summation can be truncated to m (and m can be ≪n) terms by looking at the spectrum of eigenvalues which are monotonically decreasing. After performing the SVD and truncating the expansion in equation 6 up to m terms, the shape can be represented as $$h(\phi_i) = \frac{1}{1 + e^{-\left(\mu + \sum_{j=1}^{m} a^j \sqrt{\lambda^j} \varphi_i^j - x_0\right)}}. \tag{7}$$

Depending on the discretization, the matrix $K \in \mathbb{R}^{n \times n}$ can be too large (especially for 3D domains) to store and work with. To this end, one can leverage randomized SVD (rSVD) algorithm [11] which can be implemented in a matrix free manner. The matrix-free rSVD obviates the need to store the matrix K explicitly and only requires the computation of the action K on a random vector ω i.e. Kω. With an analytically defined kernel function $k(\bullet, \bullet)$, this operation is highly parallelizable and can be implemented very efficiently.

Equation 7, when coupled with equation 3, can provide the subsurface parameterization that can be used in an FWI workflow. Rewriting equation (7) by moving the parameter ξ inside the brackets yields $$h(\phi_i) = \frac{1}{1 + e^{-\left(\xi\mu - \xi x_0 + \sum_{j=1}^{m} \xi a^j \sqrt{\lambda^j} \varphi_i^j\right)}} \tag{8}$$

The following definitions can be made: $\theta^j = \xi a^j$ and $\theta^0 = \xi\mu - \xi x_0$, and equation 8 can be manipulated by absorbing all the unknowns (ξ, μ, $x_0$, μ, $a^1$, $a^2$ ... $a^m$) in a parameter vector $\Theta = [\theta^0, \theta^1 \ldots \theta^m]^T$, and yield $$h(\phi_i) = \frac{1}{1 + e^{-\left(\theta^0 + \sum_{j=1}^{m} \theta^j \sqrt{\lambda^j} \varphi_i^j\right)}} \tag{9}$$

Equation 9 can be further simplified as $$h(\phi_i) = \frac{1}{1 + e^{-\left(\sum_{j=1}^{m} \theta^j B(i,j)\right)}}, \tag{10}$$

by defining a matrix $B \in \mathbb{R}^{n \times (m+1)}$ whose (i,j)th element is given as follows $$B(i, j) = \begin{cases} 1 & \text{if } j = 0 \\ \sqrt{\lambda^j}\, \varphi_i^j & \text{otherwise} \end{cases} \quad (11)$$

Finally, the n-dimensional shape vector, $[h(\phi_1), h(\phi_2), \ldots, h(\phi_n)]^T$, can be written in a vectorized form as shown in equation 12, where $\Theta = [\theta^0, \theta^1 \ldots \theta^m]$.

$$[h(\phi_1), h(\phi_2), \ldots, h(\phi_n)]^T = \frac{1}{1 + e^{-B\Theta}} \quad (12)$$

Thus, a shape which is characterized by n parameters in the cell-based approach, is now characterized by m+1 parameters $[\theta^0, \theta^1 \ldots \theta^m]$. The fact that m<<n brings the ultra low dimensionality to the proposed shape representation. We expect m to be 2 to 4 orders of magnitude smaller than n for 2-D and 3 to 5 orders smaller than n for 3-D domains that are typically surveyed for oil & gas exploration. For clarity, the low dimensional shape representation enabled by this invention is further illustrated in FIG. 3.

Figure 3:
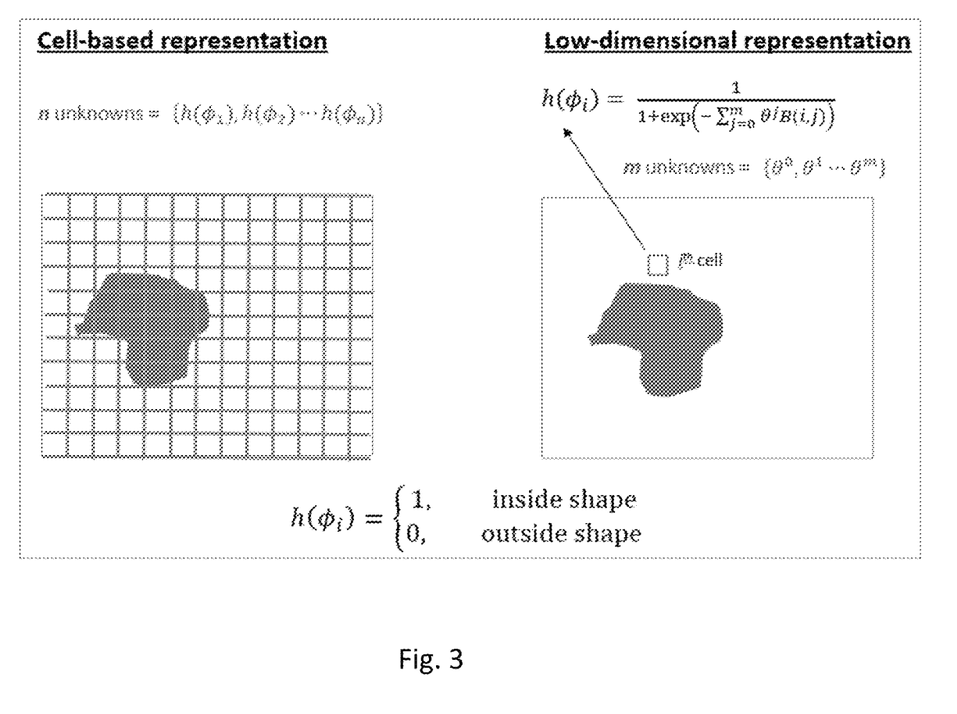
FIG. 3 is an exemplary illustration of low dimensionality introduced by an embodiment of the present technological advancement.

FIG. 3 illustrates an example of low-dimensionality induced by an embodiment of the present technological advancement. On the left is a typical cell-based, level-set representation of a shape. The number of unknowns are equal to the number of cells (n). On the right, the shape is represented using m orthogonal basis functions. $B(i,j)$ denotes the value of $j^{th}$ basis function at the centroid of $i^{th}$ cell. The m+1 unknowns, $\{\theta^0, \theta^1 \ldots \theta^m\}$, are significantly smaller than number of cells, n. The traditional cell-based, level-set representation of a shape is shown on the left, resulting in the number of unknowns to be same as the number of cells in the discretized domain. On the right, is the shape defined as per the present invention, which results in a much smaller number of unknowns. Any geo-physical inversion method (that uses any type of geophysical data such as acoustic, elastic, gravity etc.), which leverages the proposed shape representation to define a geo-body, is termed by us as low-dimensional inversion (e.g. low-dimensional full wavefield inversion, low-dimensional gravity inversion etc.).

Another aspect of the low-dimensional shape representation that can be exploited is a highly efficient implementation of the Gauss-Newton (GN) algorithm based on Jacobian sub-sampling. At every iteration of the GN algorithm, a search direction is computed via $H_\Theta^{-1} g_\Theta$, where $g_\Theta$ is the gradient and $H_\Theta$ the GN Hessian, which is obtained as $H_\Theta = [J_\kappa^c J_\Theta^\kappa]^T J_\kappa^c J_\Theta^\kappa$. The matrix $J_\kappa^c \in \mathbb{R}^{p \times n}$ is the Jacobian of misfit with respect to the cell space and $J_\Theta^\kappa \in \mathbb{R}^{n \times m}$ is the Jacobian of the transformation (from low-dimensional to cell space). This step has a time complexity of O(mnp). The symbol p denotes the number of data points collected by all the receivers collectively. Since, both n and p can be extremely large, this step can be cost prohibitive. To mitigate this cost, one can approximate the GN Hessian by appealing to a monte-carlo method for large matrix multiplications, along the line of work in [12]. The crux of this method is to define an appropriate sampling strategy to obtain matrices $\hat{J}_\Theta^\kappa$ and $\hat{J}_\kappa^c$ by sampling rows of matrix $J_\Theta^\kappa$ and rows and columns of the matrix $J_\kappa^c$, respectively. The resulting matrices are significantly smaller in dimensions, thus $$H_\Theta \approx [\hat{J}_\kappa^c \hat{J}_\Theta^\kappa]^T \hat{J}_\kappa^c \hat{J}_\Theta^\kappa$$

can be approximated efficiently. The most expensive step in this approach is the sampling of large matrices with a cost of O(np). Comparing this with the cost of exact GN Hessian, O(mnp), one can expect a 2-order speedup in the runtime of the GN algorithm.

Figure 4:
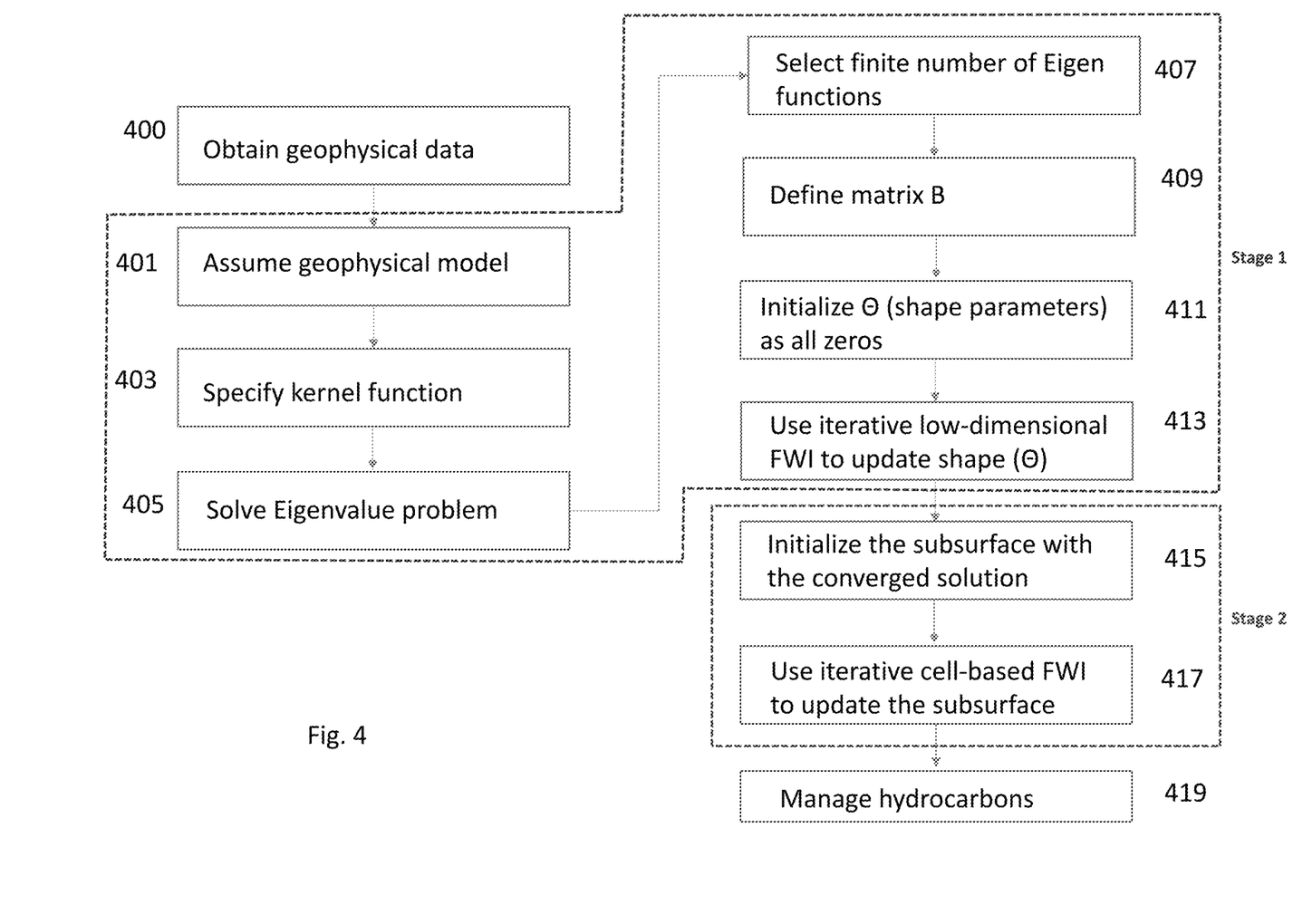
FIG. 4 illustrates an exemplary method embodying the present technological advancement.

FIG. 4 illustrates an exemplary method embodying the present technological advancement. Common FWI methods iteratively minimize the objective function which is subject to the wavefield propagation—the physics of the problem. A (nonlinear) iteration t of FWI involves the following two steps: (1) compute a search direction, $d^t$, for the current model $\Theta^t$; and (2) search for an update to the current model, $\Theta^{t+1} = \Theta^t + \alpha d^t$, which is a perturbation, $\alpha$, along the search direction and that reduces the objective function. The FWI processing starts from a given starting model $\Theta^0$ provided by the user and iteratively improve this starting model until convergence. For the first-order optimization methods, the search direction is simply the negative of the gradient, $d^t = -g_{\Theta^t}$. For the second-order optimization methods, the search direction is obtained by solving the linear system $H_{\Theta^t} d^t = -g_{\Theta^t}$, where $H_{\Theta^t}$ can be Newton's Hessian. In context of this present technological advancement, the Hessian is prohibitively expensive to compute explicitly. Instead, an approximation is sought, which can then be used to calculate the search direction. There are several choices for this approximation, such as (i) quasi-Newton methods and (ii) truncated Newton's or Gauss-Newton methods (note that "(Gauss)-Newton" is used herein to refer to both Newton and Gauss-Newton methods).

In step 400, geophysical data is obtained. The geophysical survey can be conducted on either land or at sea, using conventional arrangements of sources and receivers. The data can be loaded on to a suitable computer programmed to implement the present technological advancement.

In step 401, an geophysical model is assumed A geophysical model gives one or more subsurface properties as a function of location in a region.

In step 403, the kernel function $k: \mathbb{R}^2 \times \mathbb{R}^2 \to \mathbb{R}$ is specified, which defines the RF to be used later as a level set function for salt representation.

In step 405, the Eigenvalue problem $K\varphi = \lambda\varphi$ is solved so as to obtain n eigenvalue-eigenvector pairs, $\{\lambda^i, \varphi^i\}_{i=1}^n$, where $K \in \mathbb{R}^{n \times n}$ is the Kernel matrix whose $(i,j)^{th}$ element is obtained as $K_{ij} = k(\overline{\Omega}_i, \overline{\Omega}_j)$. Step 405 amounts to performing the SVD of the covariance matrix K. Despite being a one time operation, this factorization can be very expensive, especially for 3D domains. Hence, a matrix-free randomized SVD (rSVD) algorithm can be leveraged (as described above) that doesn't require explicit construction and storage of the matrix K.

In step 407, m is obtained such that $m = \inf\{m \in [1, 2, \ldots, n] | \Sigma_{i=1}^m \lambda^i > 0.9 \times \text{tr}(K)\}$.

In step 409, matrix B is defined such that $B \in \mathbb{R}^{n \times m+1}$ as $B = [1^n, \sqrt{\lambda^1}\varphi^1, \sqrt{\lambda^2}\varphi^2, \ldots, \sqrt{\lambda^m}\varphi^m]$.

Step 411 includes initializing $\Theta \in \mathbb{R}^{(m+1) \times 1}$ as all zeros (i.e., $\Theta^0 = 0^{m+1}$).

Step 413 includes using FWI to update $\Theta^0$. FWI is an iterative process, and step 413 can include multiple sub-steps that might be repeated (iterated over) until convergence occurs. Convergence may occur when the cost function reaches a predetermined value (i.e., the difference between data simulated from the model and the measured data is sufficiently small) or after a predetermined number of iterations.

At iteration t (and repeat until convergence):
  Obtain current subsurface as $\kappa^t = [1-h(B\Theta^t)]\kappa_{bg} + h(B\Theta^t)\kappa_{salt}$
  Obtain gradient and the Jacobian of the cost function $c(\kappa)$ with respect to $\kappa(i)$, i.e., $g_{\kappa^t}^c \in \mathbb{R}^{n \times 1}$ and $J_{\kappa^t}^c \in \mathbb{R}^{p \times n}$;
  Obtain Jacobian of $\kappa^t$ with respect to $\Theta^t$, $J_{\Theta^t}^\kappa \in \mathbb{R}^{n \times (m+1)}$;
  Obtain the gradient and the Gauss-Newton Hessian of $c(\kappa)$ with respect to $\Theta^t$ via the chain-rule, i.e., $$g_{\Theta^t} = [J_{\Theta^t}^\kappa]^T g_{\kappa^t}^c \text{ and } H_{\Theta^t} = [J_{\kappa^t}^c J_{\Theta^t}^\kappa]^T J_{\kappa^t}^c J_{\Theta^t}^\kappa.$$

To achieve almost a 2-order speedup in time per iteration, we also propose to approximate the GN hessian via Jacobian sub-sampling as described in the embodiment 40;
  Obtain the search direction as $d^t = H_{\Theta^t}^{-1} g_{\Theta^t}$. The matrix inversion in $H_{\Theta^t}^{-1} g_{\Theta^t}$ need not be carried out explicitly and other algorithms from linear algebra (conjugate gradient, cholesky factorization, SVD etc.) can be leveraged to obtain the search direction in a robust fashion.
  Update the parameters: $\Theta^{t+1} \leftarrow \Theta^t + \alpha d^t$ (wherein $\alpha$ can be obtained via a backtracking line search, for example)

In step 415, the subsurface is initialized with the converged solution from the low-dimensional FWI carried out in step 413.

Step 3417 includes using traditional cell-based FWI to iteratively update—starting from the initialized value at step 415—the entire domain using the same geophysical dataset from step 400.

In step 419, an updated subsurface model is used to manage hydrocarbons. As used herein, hydrocarbon management includes hydrocarbon extraction, hydrocarbon production, hydrocarbon exploration, identifying potential hydrocarbon resources, identifying well locations, causing a well to be drilled determining well injection and/or extraction rates, identifying reservoir connectivity, acquiring, disposing of and/or abandoning hydrocarbon resources, reviewing prior hydrocarbon management decisions, and any other hydrocarbon-related acts or activities. Moreover, hydrocarbon management can include generating a subsurface image that identifies a boundary of a salt formation.

A benefit of the present technological advancement is that it can be seamlessly integrated with conventional FWI workflows by specifying the appropriate Jacobian ($J_{\Theta^t}^\kappa$) of the transformation governed by equations 3 and 10. As the functions involved are differentiable, this Jacobian can be easily obtained analytically. Thereafter, the gradient and the Hessian in the low dimensional space can be readily computed, via chain rule, from their respective counterparts in the high-dimensional cell space.

One of the reasons of the improved ability to invert for salt bodies of the present technological advancement compared to cell-based FWI, is that the iterative parameter updates are geared toward recovering a contiguous geobodies with sharp boundaries between the geobody (salt) and the background (sediment). On the contrary, in cell-based FWI, there isn't any notion of a geobody as each cell acts independently to reduce the data misfit in equation 1. This fundamental difference, coupled with the fact that the resulting low-dimensionality helps with the ill-posedness via some form of implicit regularization, contributes to the improved performance of this invention, as is empirically demonstrate next.

Figure 5A:
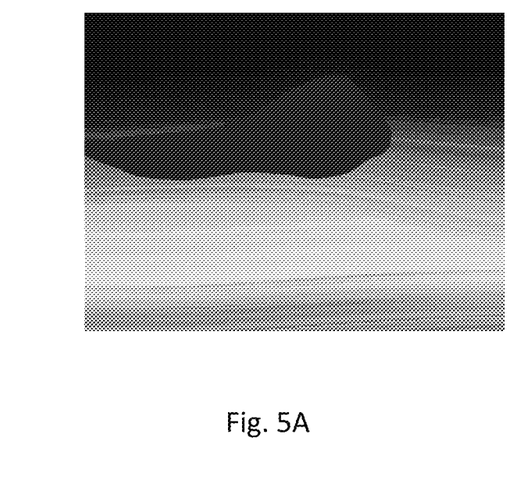
FIG. 5A illustrates an exemplary slice of subsurface with a salt body.
Figure 5B:
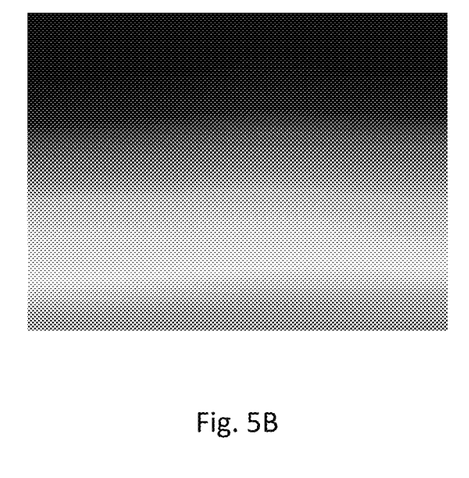
FIG. 5B illustrates an exemplary smooth approximation of the domain that will be used as an initial guess during the FWI process.

The following simulations were conducted to evaluate the benefits of the present technological advancement. The ultra low-dimensional shape-based FWI results are compared against the conventional cell-based FWI. The chosen synthetic subsurface model was inspired by the SEG Advanced Modelling (SEAM) data set, though made smaller and restricted to two-dimensions. The true subsurface (with the salt body) is shown in FIG. 5A. A smooth version of the domain, which serves as the background, is shown in FIG. 5B. The domain is discretized in 401×401 uniform grid, resulting in n=160,801 cells. The steps laid out in FIG. 4 are followed to carry out the salt inversion. For the Kernel matrix, the Matérn kernel is used, whose definition is given in equation 13. At this time, the choice of Matérn kernel is not strictly grounded on any particular insight about the subsurface, but is mainly influenced by the fact that it is a popular choice in image processing and geostatistics applications.

$$k(\Omega_i, \Omega_j) = \left(1 + \frac{\sqrt{3}\|\Omega_i - \Omega_j\|}{\rho}\right) \exp\left(-\frac{\sqrt{3}\|\Omega_i - \Omega_j\|}{\rho}\right) \quad (13)$$

The parameter $\rho$ governs the smoothness of the random field and has a similar effect as that of the parameter $\sigma$ (of the squared exponential kernel) on the RFs shown in FIGS. 1A and 1B. The value of $\rho$ is fixed at 0.2 In this example, a full SVD was not necessary Instead, a thin-SVD was performed until the condition in step 307 was satisfied. For this example, the truncation was achieved at m=131, which leads to 132 unknown parameters, which is drastically smaller than the number of cells n=160,801.

Figure 6A:
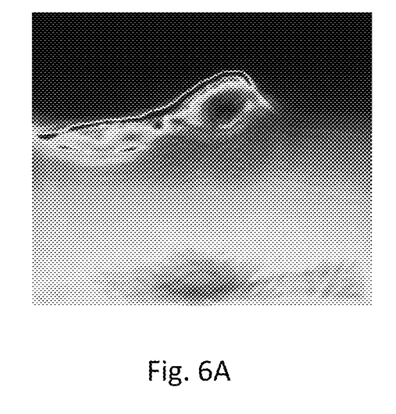
FIG. 6A illustrates an exemplary recovered subsurface after 1000 iterations of a conventional FWI process.
Figure 6B:
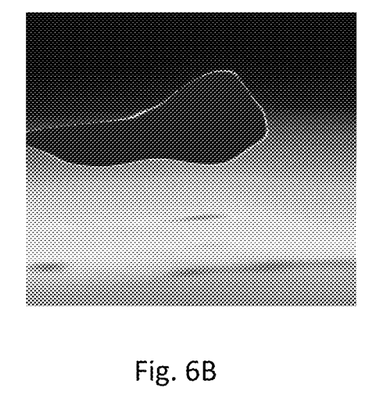
FIG. 6B illustrates an exemplary recovered subsurface after 500 iterations of an FWI process embodying the present technological advancement.

FIG. 6A shows the subsurface model after carrying out 1000 iterations of the cell-based FWI. Except for the top, the salt geometry was poorly reconstructed. The sediments, especially underneath the salt, are also poorly recovered, confirming the struggles of cell-based FWI in the presence of salt FIG. 6B shows the recovered subsurface after 500 iterations of the present technological advancement. Note that the background was fixed at smooth approximation (FIG. 5B) during this process, and the subsurface is obtained via equation 3 On comparison with the ground truth in FIG. 5A, the salt is seen to be recovered very well. The present technological advancement is an improvement in how the computer can generate a subsurface image, as shown by the comparison of FIGS. 6B and 5A. By reducing the number unknowns (lower dimensionality), the inversion is sped up because the computational time of the inversion is directly proportional to the number of unknowns.

Figure 6C:
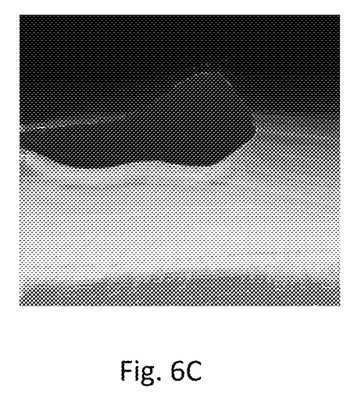
FIG. 6C illustrates an exemplary recovered subsurface after 500 iterations of a conventional FWI process, but now initialized with the subsurface recovered in FIG. 5B.
Figure 7:
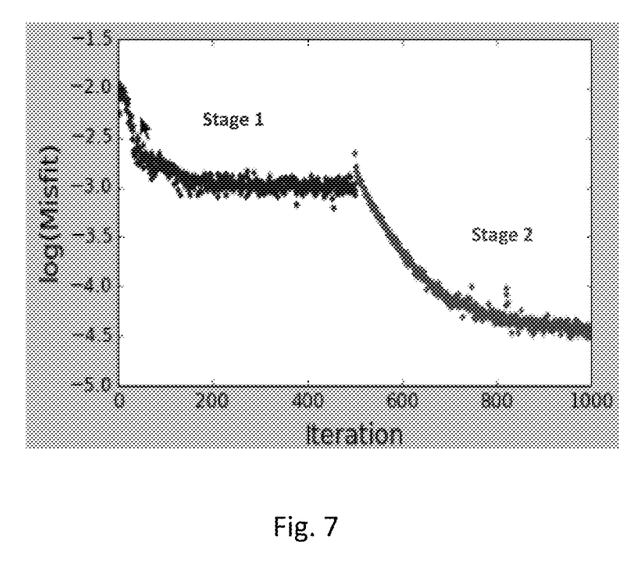
FIG. 7 illustrates an exemplary plot of cost function (misfit) vs. iteration.

Furthermore. FIG. 6C shows the subsurface model after additional 500 iterations of cell-based FWI, but now initialized with the recovered salt body from FIG. 6B. The improved performance of cell-based FWI, when seeded with the right salt geometry, is clearly evident if we compare FIG. 6C with 6A. FIG. 7 further corroborates this point by plotting the cost function vs. the iteration for the two staged inversion employed in the current example. After the salt inversion via this invention, the misfit drops another order of magnitude, since the cell-based FWI, now equipped with correct salt geometry, can resolve the sediments much more effectively.

In all practical applications, the present technological advancement must be used in conjunction with a computer, programmed in accordance with the disclosures herein. Preferably, in order to efficiently perform FWI, the computer is a high performance computer (HPC), known to those skilled in the art. Such high performance computers typically involve clusters of nodes, each node having multiple CPU's and computer memory that allow parallel computation. The models may be visualized and edited using any interactive visualization programs and associated hardware, such as monitors and projectors. The architecture of system may vary and may be composed of any number of suitable hardware structures capable of executing logical operations and displaying the output according to the present technological advancement. Those of ordinary skill in the art are aware of suitable supercomputers available from Cray or IBM.

The foregoing description is directed to particular embodiments of the present technological advancement for the purpose of illustrating it. It will be apparent, however, to one skilled in the art, that many modifications and variations to the embodiments described herein are possible. All such modifications and variations are intended to be within the scope of the present invention, as defined by the appended claims.

The following references are incorporated by reference in their entirety:
1. Parametric Level Set Methods for Inverse Problems, A. Aghasi, M. Kilmer, E. L. Miller, Siam Journal of Imaging Sciences, 4 (2), pp 618-650, 2011;
2. Salt Reconstruction in Full Waveform Inversion with a parametric Level-Set Method, A. Kadu, T. V. Leeuwen, W. A. Mulder, IEEE Transactions on Computational Imaging 3 (2), pp 305-315, 2017;
3. Parametric level-set full-waveform inversion in the presence of salt bodies, A. Kadu, T. V. Leeuwen, W. A. Mulder, (2017) SEG Technical Program Expanded Abstracts, pp. 1518-1522, 2017;
4. Gaussian Processes in Machine Learning, Chapter 4: Covariance Functions, C. E. Rasmussen, C. K. I. Williams, MIT Press, pp. 79-102, 2006;
5. Random Fields: Analysis and Synthesis, Chapter 2: Fundamentals of Analysis of Random Fields, E. Vanmarcke, World Scientific Publishing Company, pp. 13-74, 2010;
6. A level set approach to salt geometry inversion in full-waveform inversion, W. Lewis, B. Starr, D. Vigh, (2012) SEG Technical Program Expanded Abstracts, pp. 1-5, 2012;
7. 3D full waveform inversion on a Gulf of Mexico WAZ data set, D. Vigh, B. Starr, J. Kapoor, and H. Li, (2010) SEG Technical Program Expanded Abstracts, pp. 957-961, 2010;
8. Kernel-based approximation methods using MATLAB, G. Fasshauer, M. McCourt, Interdisciplinary Mathematical Sciences: Volume 19, Chapter 5: Connection to Kriging, pp. 89-107, 2015;
9. U.S. Pat. No. 9,121,964; and
10. Tarantola, A., Inversion of seismic reflection data in the acoustic approximation: Geophysics, 49, 1259-1266, 1984.
11. Halko N., Martinsson P., Tropp J. A., Finding structure with randomness: Probabilistic algorithms for constructing approximate matrix decompositions: SIAM Review, 53(2), 2011.
12. Drineas P., Kannan R. and Mahoney M. W., Fast monte carlo algorithms for matrices II: approximating matrix multiplication, SIAM J. Comput. 36 (2006) 132-157.

What is claimed is:

1. A two-stage method for iteratively inverting geophysical data for the purpose of subsurface imaging, comprising:
obtaining at least one geophysical dataset and an initial subsurface model;
representing a subsurface such that a geometry of a geobody is defined using a set of basis functions, and a number of such basis functions is an order of magnitude smaller than a number of cells used in cell-based geobody representations, wherein an order of magnitude reduction is two or more for 2-D domains and 3 or more for 3-D domains;
in a first stage, successively updating the initial subsurface model, only for the geobody, by performing iterative low-dimensional geophysical inversion based on minimizing a misfit between simulated geophysical data and the geophysical dataset, wherein the simulated geophysical data is generated from a current subsurface model at each iteration;
generating a subsurface image from a final updated subsurface model obtained via the low-dimensional geophysical inversion, wherein the subsurface image includes an inverted geobody;
in a second stage, successively updating the subsurface model with the inverted geobody by performing iterative cell-based geophysical inversion based on minimizing a misfit between simulated geophysical data and the geophysical dataset, wherein the simulated geophysical data is generated from a current subsurface model at each iteration.

2. The method of claim 1, wherein the geophysical inversion comprises at least one of full wavefield inversion, travel-time tomography, gravity inversion and magnetic inversion.

3. The method of claim 1, wherein the basis functions are orthogonal.

4. The method of claim 3, wherein the set of orthogonal basis functions approximates a random field endowed with a positive definite kernel function, and wherein the positive definite kernel function characterizes the geometry of a geobody.

5. The method of claim 4, wherein the set of orthogonal basis functions are ordered and obtained by an eigen-decomposition a n×n kernel matrix (n=number of cells) to yield eigenvectors and eigenvalues, and the method includes truncating the number of the eigenvectors to keep for geobody representation.

6. The method of claim 5, wherein the eigen-decomposition of a kernel matrix is performed using a matrix-free, randomized algorithm for matrix factorization.

7. The method of claim 5, wherein a linear combination of the truncated set of ordered eigenvectors undergoes a transformation using a twice-differentiable approximate Heaviside function to yield shapes with boundaries whose sharpness is controlled by the Heaviside function's parameter.

8. The method of claim 7, wherein coefficients of the truncated set of ordered eigenvectors along with parameters of the Heaviside function form unknowns that are updated iteratively by the low-dimensional geophysical inversion.

9. The method of claim 1, further comprising obtaining a gradient and a Jacobian of a function describing the misfit with respect to a low-dimensional parameter space in the first stage, from a gradient and a Jacobian of a function describing the misfit with respect to cell-space via application of chain rule.

10. The method of claim 1, further comprising approximating a Gauss-Newton Hessian of a function describing the misfit with respect to a low-dimensional parameter space by sub-sampling a Jacobian in the first stage.

11. The method of claim 1, further comprising causing a well to be drilled at a location derived from the subsurface image.

12. The method of claim 1, wherein the geobody is a salt body.

* * * * *